US006968527B2

(12) United States Patent
Pierrat

(10) Patent No.: US 6,968,527 B2
(45) Date of Patent: Nov. 22, 2005

(54) HIGH YIELD RETICLE WITH PROXIMITY EFFECT HALOS

(75) Inventor: Christophe Pierrat, Santa Clara, CA (US)

(73) Assignee: Synopsys Inc., Mountain View, CA (US)

( * ) Notice: Subject to any disclaimer, the term of this patent is extended or adjusted under 35 U.S.C. 154(b) by 364 days.

(21) Appl. No.: 10/369,713

(22) Filed: Feb. 19, 2003

(65) Prior Publication Data

US 2003/0154461 A1 Aug. 14, 2003

Related U.S. Application Data

(62) Division of application No. 09/676,400, filed on Sep. 29, 2000, now Pat. No. 6,557,162.

(51) Int. Cl.[7] .............................. G06F 17/50; G03F 1/00
(52) U.S. Cl. .............................. 716/19; 716/4; 716/21; 430/4
(58) Field of Search ........................ 716/1, 4, 5, 19–21; 430/4, 5, 30; 382/144–145; 250/492.1, 492.22

(56) References Cited

U.S. PATENT DOCUMENTS

| | | | |
|---|---|---|---|
| 4,426,584 A | 1/1984 | Bohlen et al. ............ 250/492.2 |
| 4,520,269 A | 5/1985 | Jones ....................... 250/492.2 |
| 4,692,579 A | 9/1987 | Saitou et al. ............. 250/492.2 |
| 4,895,780 A | 1/1990 | Nissan-Cohen et al. ........ 430/5 |
| 5,051,598 A | 9/1991 | Ashton et al. ........... 250/492.2 |
| 5,241,185 A | 8/1993 | Meiri et al. .............. 250/492.2 |
| 5,282,140 A | 1/1994 | Tazawa et al. .............. 364/468 |
| 5,432,714 A | 7/1995 | Chung et al. ............... 364/525 |
| 5,533,148 A | 7/1996 | Sayah et al. ................ 382/240 |
| 5,631,110 A | 5/1997 | Shioiri et al. ................. 430/5 |
| 5,705,301 A | 1/1998 | Garza et al. .................... 430/5 |
| 5,795,682 A | 8/1998 | Garza ............................. 430/5 |
| 5,815,685 A | 9/1998 | Kamon ....................... 395/500 |
| 5,847,959 A | 12/1998 | Veneklasen et al. ... 364/468.28 |
| 5,863,682 A | 1/1999 | Abe et al. ...................... 430/30 |
| 5,885,734 A | 3/1999 | Pierrat et al. ................... 430/5 |
| 5,900,338 A | 5/1999 | Garza et al. .................... 430/5 |
| 5,922,497 A | 7/1999 | Pierrat ............................ 430/5 |
| 5,923,566 A | 7/1999 | Galan et al. ................. 364/489 |
| 5,974,243 A | 10/1999 | Moh et al. ............. 395/500.03 |
| 6,009,250 A | 12/1999 | Ho et al. ............... 395/500.06 |

(Continued)

FOREIGN PATENT DOCUMENTS

GB 2324169 10/1998

(Continued)

OTHER PUBLICATIONS

Rieger, M., et al., "Using Behavior Modeling for Proximity Correction", Precim Company, Portland, Oregon (6 pages).

(Continued)

*Primary Examiner*—Leigh M. Garbowski
(74) *Attorney, Agent, or Firm*—Bever, Hoffman & Harms, LLP; Jeanette S. Harms

(57) ABSTRACT

A lithography reticle advantageously includes "proximity effect halos" around tight tolerance features. During reticle formation, the tight tolerance features and associated halos can be carefully written and inspected to ensure accuracy while the other portions of the reticle can be written/inspected less stringently for efficiency. A system for creating a reticle data file from an IC layout data file can include a processing module and a graphical display. The processing module can read the IC layout data file, identify critical features and define a halo region around each of the critical features. The graphical user interface can facilitate user input and control. The system can be coupled to a remote IC layout database through a LAN or a WAN.

30 Claims, 7 Drawing Sheets

U.S. PATENT DOCUMENTS

| | | | |
|---|---|---|---|
| 6,009,251 A | 12/1999 | Ho et al. | 395/500.06 |
| 6,011,911 A | 1/2000 | Ho et al. | 395/500.06 |
| 6,045,584 A | 4/2000 | Benzel et al. | 716/11 |
| 6,077,307 A | 6/2000 | Benzel et al. | 716/2 |
| 6,077,310 A | 6/2000 | Yamamoto et al. | 716/19 |
| 6,081,658 A | 6/2000 | Rieger et al. | 395/500.22 |
| 6,269,472 B1 | 7/2001 | Garza et al. | 716/21 |
| 6,282,696 B1 | 8/2001 | Garza et al. | 716/19 |
| 6,301,697 B1 * | 10/2001 | Cobb | 716/19 |
| 6,778,695 B1 * | 8/2004 | Schellenberg et al. | 382/144 |
| 2002/0010904 A1 | 1/2002 | Ayres | 716/19 |

FOREIGN PATENT DOCUMENTS

| | | |
|---|---|---|
| WO | WO 00/36525 A2 | 6/2000 |
| WO | WO 02/29491 A1 | 4/2002 |

OTHER PUBLICATIONS

Hirai, Y., et al., "Automatic Pattern Generation System for Phase Shfiting Mask", 1991 Symposium on VLSI Technology, Digest of Technical Papers, pp. 95-96, May 28-30, 1991.

Wong, A., et al., "Investigating Phase-Shifting Mask Layout Issues Using a Cad Toolkit", IEEE, pp. 27.4.1-27.4.4 (1991).

Harafuji, K., et al., "A Novel Hierarchical Approach for Proximity Effect Correction in Electron Beam Lithography", IEEE, vol. 12, No. 10, pp. 1508-1514, Oct. 1993.

Rieger, M., et al., "System for Lithography Proximity Compensation", Precim Company, Portland, Oregon, Sep. 1993 (28 pages).

Moniwa, A., et al., "Algorithm for Phase-Shift Mask Design with Priority on Shifter Placement", Jpn. J. Appl. Phys., vol. 32, Pt. 1, No. 12B, pp. 5874-5891, Dec. 1993.

Ooi, K., et al., "Computer Aided Design Software for Designing Phase-Shifting Masks", Jpn. J. Appl. Phys., vol. 32, Pt. 1, No. 12B, pp. 5887-5891, Dec. 1993.

Hedenstierna, N., et al., "The Halo Algorithm—An Algorithm for Hierarchical Design of Rule Checking of VLSI Circuits", IEEE, vol. 12, No. 2, pp. 265-272, Feb. 1993.

Pierrat, C., et al., "A Rule-Based Approach to E-Beam and Process-Induced Proximity Effect Correction for Phase-Shifting Mask Fabrication", SPIE, vol. 2194, pp. 298-309 (1994).

Stimiman, J., et al., "Wafer Proximity Correction and Its Impact on Mask-Making", Bacus News, vol. 10, Issue 1, pp. 1, 3-7, 10-12, Jan. 1994.

Moniwa, A., et al., "Heuristic Method for Phase-Conflict Minimization in Automatic Phase-Shift Mask Design", Jpn. J. Appl. Phys., vol. 34, Pt. 1, No. 12B, pp. 6584-6589, Dec. 1995.

* cited by examiner

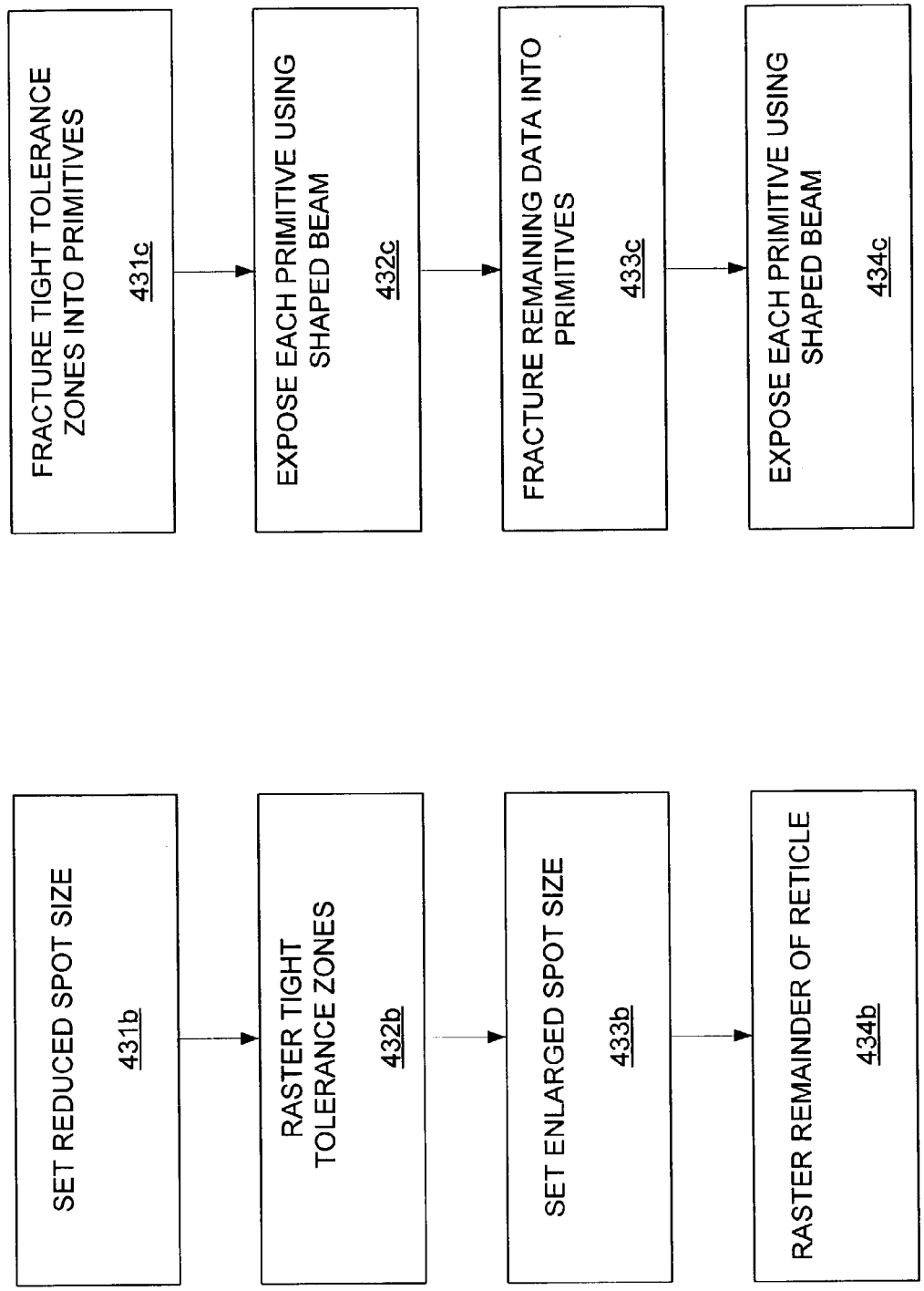

HIGH YIELD RETICLE WITH PROXIMITY EFFECT HALOS

RELATED APPLICATIONS

This application is a divisional of U.S. patent application Ser. No. 09/676,400, now U.S. Pat. No. 6,557,162, entitled, "Method For High Yield Reticle Formation", filed on Sep. 29, 2000 incorporated by reference herein.

FIELD OF THE INVENTION

The present invention relates to semiconductor device manufacturing and specifically to the efficient production of reticles for lithographic processes.

BACKGROUND OF THE INVENTION

Lithography masks (or "reticles") are key elements used in the production of integrated circuits (ICs). A portion of an IC layout data file (typically a representation of a physical layer, such as a metal layer or a polysilicon layer, of the final IC) is etched into a thin chrome layer formed over a glass plate to form a reticle. This reticle pattern ("reticle layout") is then exposed onto a layer of photosensitive resist on the surface of the wafer. Finally, the top surface of the wafer is chemically etched away in the areas not covered by the photoresist, thereby transferring the reticle layout onto the wafer. This transference process is known as lithography. The accuracy of the pattern formed on the wafer ("printed layout") significantly affects both process yield and the performance of the final IC.

The actual reticle formation process typically involves the steps of exposing the reticle pattern into a layer of resist on a blank reticle, developing the resist pattern (i.e. removing the exposed or unexposed portions of the resist layer), etching the resist pattern into the chrome layer of the reticle, inspecting the chrome pattern, and repairing any defects found in the chrome pattern.

While an optical projection (e.g. a laser beam scanner) system can be used to expose the reticle pattern into the resist layer, complex modern layouts are typically written by an electron beam scanner. Two main techniques are used in the exposing step of the electron beam writing process—raster scan and vector scan. In a raster scan system, the output of the scanner is moved in horizontal passes across the entire reticle and shifted an increment downwards after each pass, with the electron beam being applied to regions where the resist is to be exposed. The "spot size" of the electron beam can be set small to enable precise scanning of the reticle layout. However, a larger spot size is desirable to speed up the scanning process. Therefore, accuracy and throughput must be traded off against one another in conventional raster scan writing processes. An example of a raster scan system is the MEBES family of tools (models 4000, 4500, 5000, 5500) from Etec Systems, Inc. (a subsidiary of Applied Materials Inc.).

In a vector scan system, the electron beam is moved directly to regions that are to be exposed. Most modern vector scan systems employ a shaped spot technique, in which the electron beam is formed into various primitive shapes (rectangles and triangles). The regions to be exposed are decomposed into primitives (rectangles and triangles), and each primitive is then exposed in a single shot by the electron beam, which is shaped to match the primitive being exposed. Vector scanning can be more efficient than raster scanning since the write tool does not have to scan the entire surface of the reticle. Therefore, a sparse layout will be written much faster on a vector scan system than a raster scan system. However, individually targeting the many features in a dense, complex layout can make a vector scan system take longer to write the layout than a raster scan system. And as with raster scanning, beam spot size selection still must balance accuracy and throughput. Examples of vector scan systems include the JBX-6000FS from JEOL, Inc., the Vectorbeam from Leica Lithography Systems, Ltd., and the HL-800, HL-900, and HL-950 tools from Hitachi.

After the resist layer has been exposed, the resist pattern is developed. A negative resist is converted by the exposing radiation or electron beam into an insoluble state, and the developing process removes all the non-exposed portions of the resist layer. Exposure of a positive resist transforms the resist from an insoluble state into a soluble state, and the developing process then removes all the exposed portions of the resist layer. The chrome layer of the reticle is then etched through the pattern formed in the resist layer, after which the remaining resist is stripped from the reticle.

Next, an inspection tool checks to ensure that the IC layout has been properly written to the reticle. An optical image of the mask layout is checked against the original IC layout data, which may be modified to more accurately represent the expected output. Alternatively, for a reticle comprising multiple identical die layouts, the optical images of the individual die layouts can be compared against each other. Regardless of the specific comparison technique, the inspection sensitivity (i.e. the precision with which inspection is performed) is a key parameter of the inspection process. Because the entire reticle is typically inspected, a high inspection sensitivity can significantly increase the time required complete the process. A lower inspection sensitivity can reduce the inspection time, but may miss defects or deviations in the reticle layout. Therefore, conventional inspection techniques are faced with a tradeoff between inspection sensitivity and efficiency.

Finally, defects and deviations detected during the inspection process are corrected. A laser tool (laser zapping or laser assisted deposition) is often used for rapid corrections, while a focused ion beam tool (ion milling or ion-assisted etch or deposition) provides more precise, yet slower, modifications.

FIG. 1 shows a technique proposed in an effort to address these mask making and inspection issues as described by Glasser et al., in PCT Patent Application No. PCT/US99/30240, filed Dec. 17, 1999. FIG. 1 shows a portion of an original IC layout comprising a diffusion region 110 and a polysilicon region 120. A critical region 130 of polysilicon region 120 is identified where polysilicon region 120 overlies diffusion region 110. This overlap of polysilicon region 120 and diffusion region 110 represents a transistor gate to be formed in the final IC device. As a key feature of the final IC, the gate requires a high degree of precision to ensure proper performance of the transistor in the final IC device. However, other features of the IC layout may not require such a high degree of dimensional accuracy. For example, interconnects and contact pads can occupy a wider tolerance band than transistor gates without significantly affecting device performance. Consequently, by flagging critical regions such as region 130, special care can be directed towards those regions during mask making and/or inspection (e.g. very high inspection sensitivity). Less stringent standards (e.g. lower inspection sensitivity) can then be applied to the remaining regions to improve throughput. Therefore, Glasser et al. attempts to efficiently form a high-yield reticle, i.e. a reticle that will produce critical features of the final IC accurately and consistently.

However, even though a particular portion of the original IC layout may correspond to a key feature in the final IC device, the actual creation of the key feature typically depends on much more than just the representation of that particular portion of the IC layout in a reticle. The mask-writing processes used to transfer the layout data to a reticle and the lithographic procedures used to print the reticle layout on a wafer are subject to "proximity effects", wherein the final dimensions of the features formed during the transference processes are affected by the presence or absence of neighboring features. For example, during optical lithography, the width of closely spaced lines may be different from the width of isolated lines, even if all the lines have the same width in the reticle. Also, the dimensions and regularity of a printed image can be affected by portions of adjacent features or even by nearby defects.

An example of a defect-induced proximity effect is shown in FIGS. 2a and 2b. FIG. 2a shows a portion of a polysilicon layer reticle 200 that includes a reticle feature 210. Reticle feature 210 includes a critical region 211 (identified according to the technique of Glasser et al.; i.e. flagging the portion of reticle feature 210 that overlies a diffusion region in the original IC layout) that corresponds to a transistor gate to be formed in the final IC device. Special attention can then be paid to critical region 211 during formation and inspection of reticle 200.

However, reticle 200 also includes a defect 212; i.e. an unintended marking in the opaque (chrome) layer of the reticle. Because regions outside of critical region 211 are written and inspected with less care than critical region 211 as taught by Glasser et al., defects like defect 212 are more likely to be created and be undetected in regions outside of critical region 211. FIG. 2b shows portion of a wafer 220 that includes a polysilicon feature 230 that might be produced from a lithography step using reticle 200. Polysilicon feature 230 includes an actual gate profile 221 that deviates from a desired gate profile 240. Actual gate profile 221 is created because of the proximity effects between reticle feature 210 and reticle defect 212 during lithography. Therefore, despite the identification of the critical region of the original IC layout and subsequent care focused on that critical region during both the reticle making and reticle inspecting steps, the final IC structure is undesirably deformed.

In addition, there may be purposely-added features outside of critical region 211 that play an important role in the formation of the final transistor gate. A technique known as optical proximity correction (OPC) has been developed in which features are introduced around (or modifications are made to) a critical layout feature to "precompensate" for predicted deformations during the lithography process. These OPC features and modifications must be reproduced with the same degree of accuracy as the actual layout feature of interest to ensure their proper effect. Similarly, original layout features adjacent to the critical feature must also be accurately formed so that their effects can be reliably taken into account when incorporating OPC features. However, because the critical region only includes the critical feature itself, these influential external features will not receive the same degree of care in construction as the critical feature, often resulting in a less-than-desired final IC accuracy. Accordingly, it is desirable to provide a method for ensuring accurate formation and inspection of reticles that does not allow proximity effects to introduce unexpected deviations in the final IC features.

SUMMARY OF THE INVENTION

In some lithographic techniques, a critical feature in a layout can be targeted for special processing. However, the actual creation of the critical feature may depend on much more than just the representation of that particular portion of the IC layout in a reticle. The mask-writing processes used to transfer the layout data to a reticle and the lithographic procedures used to print the reticle layout on a wafer are subject to "proximity effects". In other words, the final dimensions of the features formed during the transfer can be affected by the presence or absence of neighboring features. For example, during optical lithography, the width of closely spaced lines may be different from the width of isolated lines, even if all the lines have the same width in the reticle. Also, the dimensions and regularity of a printed image can be affected by portions of adjacent features or even by nearby defects.

Therefore, in accordance with one aspect of the invention, "proximity effect halos" can be specified in an IC layout data file. The proximity effect halos represent the areas around tight tolerance layout features (i.e. layout features that correspond to features in the final IC that must be accurately formed) that can have an effect on the formation or inspection of those tight tolerance layout features. By applying a high degree of care to the proximity effect halos (as well as the tight tolerance layout features surrounded by the proximity effect halo regions) during reticle creation, a reticle capable of providing a high yield lithography process can be created. At the same time, once those areas requiring this enhanced scrutiny are identified, the remainder of the IC layout can be processed using less rigorous standards, thereby reducing the production time and cost of the reticle.

The width of the proximity effect halo is defined such that proximity effects on the enclosed tight tolerance layout feature by features and/or defects outside the halo region are below a specified threshold level. In one embodiment of the invention, this width can be determined empirically, through measurements taken from the process(es) in which the IC layout will be used. In another embodiment of the invention, the width can be estimated by modeling the processes for making and using the reticle. For example, in an optical lithography process, proximity effects are proportional to the wavelength of the light used to expose the wafer, and are inversely proportional to the numerical aperture of the tool. Resist and etch effects can further add to the proximity effects, though such processes are less well characterized. Therefore, the width of the halo can be estimated by dividing wavelength by numerical aperture and multiplying the result by a constant to compensate for the resist/etch effects. Also, in an electron beam reticle writing operation, forward scattering and backscattering of the beam during the exposure process can introduce substantial proximity effects. Here too, modeling or data analysis could be used to determine an appropriate proximity effect halo width. In any case, the process in which proximity effects have the greatest range should control the width of the halo.

Once defined, the proximity effect halos can then be used to facilitate the production of high-yielding reticles. According to one embodiment of the invention, a raster scan tool can be used to write the reticle. Specifically, a small spot size is used to accurately expose the tight tolerance layout features and the proximity effect halos, whereas a larger spot size is used to efficiently expose the remainder of the reticle. According to another embodiment of the invention, a vector scan tool can be used to write the reticle. Because tight tolerance layout features and associated proximity effect halos can be fractured individually, problems due to oddly shaped primitives can be minimized.

Using this exposure technique, a reticle can include a first set of layout features having a first tolerance and a second set of layout features being within a proximity effect halo of the first set of layout features. Of importance, the second set of layout features also has the first tolerance. A third set of layout features, which are outside the proximity effect halo of the first set of layout feature, have a second tolerance, wherein the second tolerance is less tight than the first tolerance.

Exemplary features included in the first set of layout features could include transistor gates and/or capacitors. Other exemplary features included in the first set of layout features could include features associated with optical proximity corrections. In this case, exemplary features included in the second set of layout features could include the associated optical proximity corrections. Exemplary features included in the third set of layout features could include interconnect lines and/or contact pads.

In one embodiment, the proximity effect halo includes an inner perimeter and an outer perimeter, wherein a distance between the inner perimeter and the outer perimeter is substantially constant. The lithographic process in which the reticle will be used can determine this distance. Specifically, a reticle is generally used in a lithography process using an exposing radiation of a substantially constant wavelength and having a substantially constant numerical aperture (NA). In this case, the distance can be estimated by dividing the wavelength by the NA and multiplying the result by a constant correction factor to compensate for resist and etch effects. For example, the distance is approximately equal to 1.5 microns when the substantially constant wavelength is 365 nm and the NA is 0.6. In another example, the distance is approximately equal to 1.0 microns when the substantially constant wavelength is 248 nm and the NA is 0.6. In yet another example, the distance is between 3.0 $\mu$m and 3.75 $\mu$m for a 50 keV electron beam reticle writing process.

According to one embodiment of the invention, a reticle production system includes a computer and a graphical display, wherein the computer reads an IC layout data file, identifies tight tolerance layout features, and defines proximity effect halos around the tight tolerance layout features. According to an aspect of the invention, the key features can be manually identified (i.e. individually selected) by a user. According to another aspect of the invention, the user can specify specific layout features or configurations to be identified as key features. In one embodiment of the invention, a graphical user interface is provided to enable user input and control. In another embodiment of the invention, the reticle production system can be coupled to receive the IC layout data file from a remote database through a local area network or a wide area network. According to yet another embodiment of the invention, the reticle production system can be coupled to a reticle writing tool, which receives a reticle data file that includes the proximity effect halo data from the computer.

BRIEF DESCRIPTION OF THE DRAWINGS

FIG. 4b shows a flow diagram of a reticle writing operation using a raster scan tool in accordance with an embodiment of the invention.

FIG. 4c shows a flow diagram of a reticle writing operation using a vector scan tool in accordance with an embodiment of the invention.

DETAILED DESCRIPTION OF THE DRAWINGS

Figure 1:
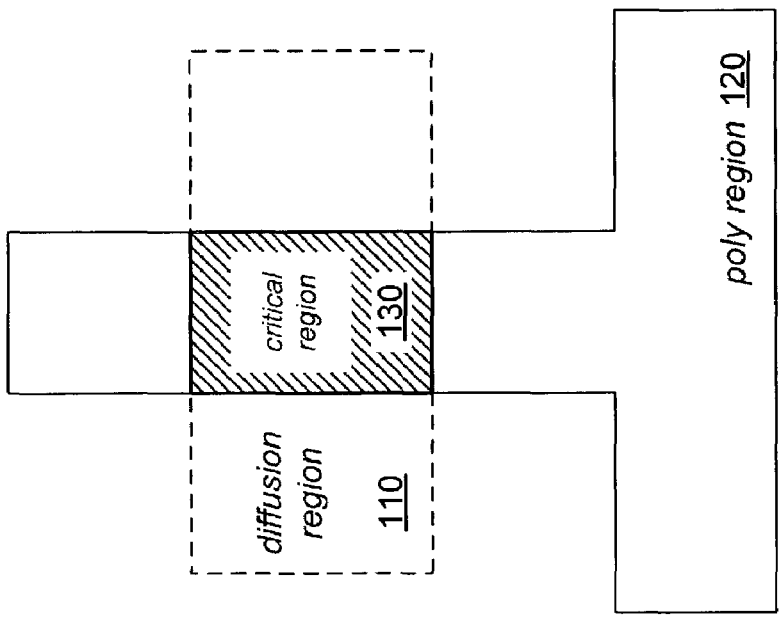
FIG. 1 shows a sample portion of an IC layout having a critical region flagged in accordance with the prior art.
Figure 2B:
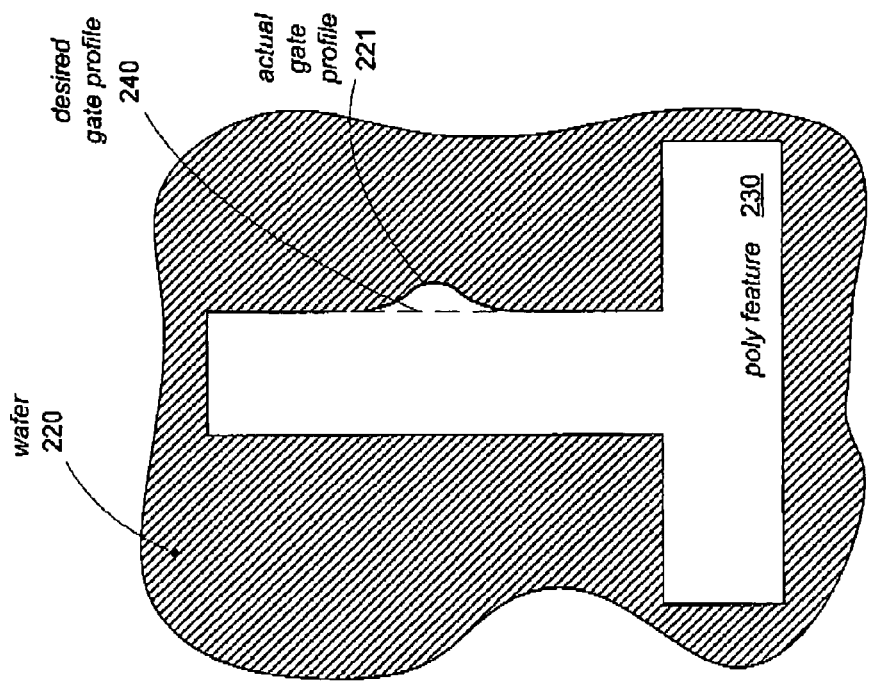
FIGS. 2a and 2b illustrate a proximity effect caused by a reticle defect.
Figure 2A:
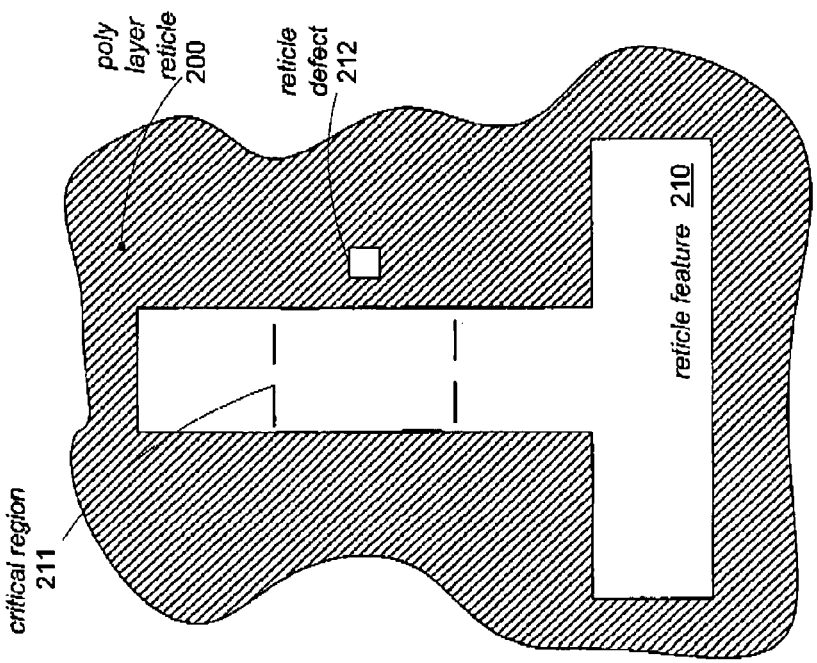
Figure 3:
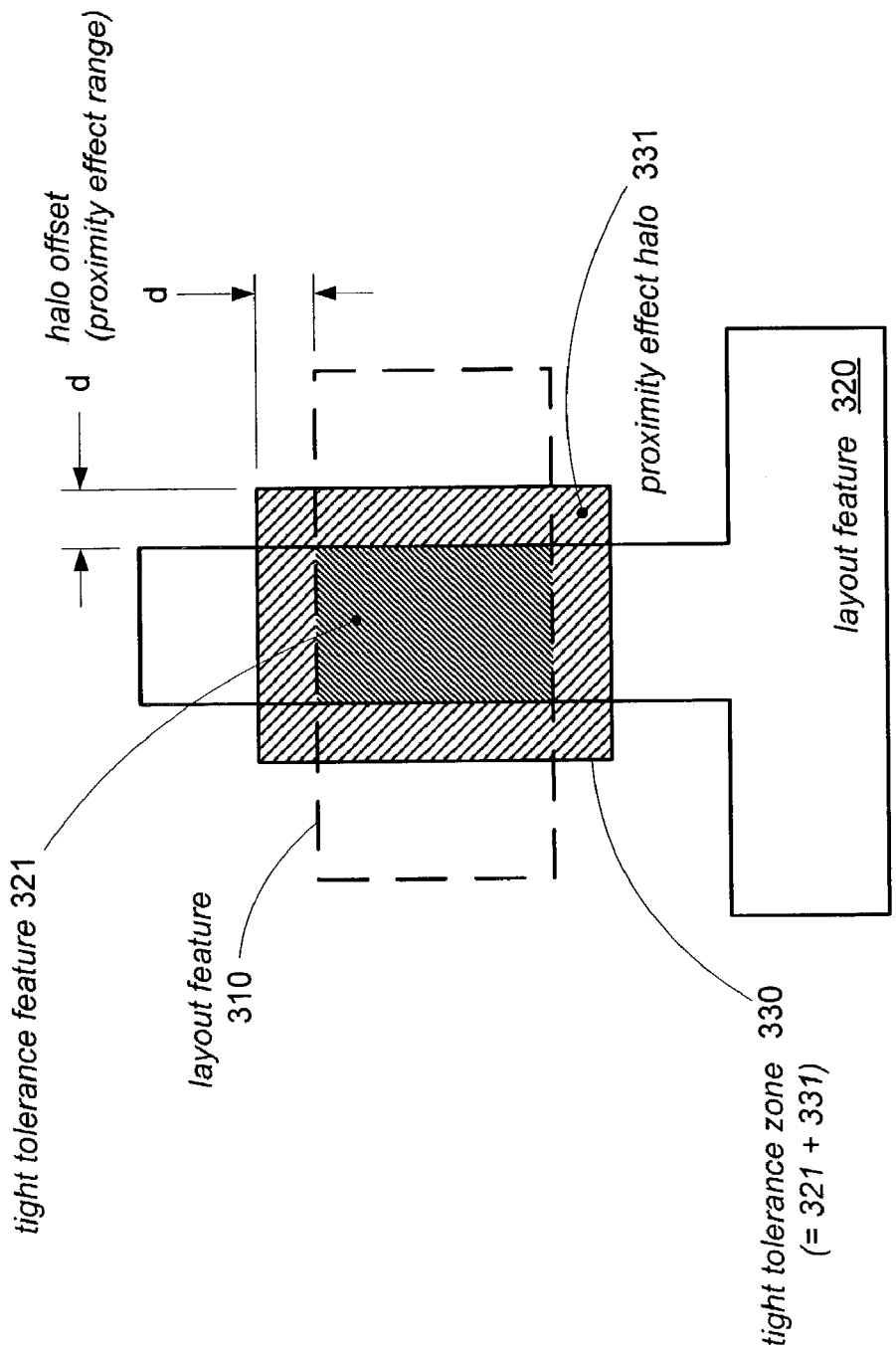
FIG. 3 shows a sample proximity effect halo in accordance with the invention.

FIG. 3 provides an example of a "tight tolerance feature" that could require special attention during reticle writing to ensure proper device formation during lithography. FIG. 3 shows sample layout features 310 and 320 that can commonly be found in a conventional IC layout design. As depicted in FIG. 3, layout feature 320 represents a feature to be formed in a polysilicon layer of an IC, over a diffusion region represented by layout feature 310. Layout features 310 and 320 therefore designate a transistor to be formed in the IC, the gate of the transistor being defined where layout feature 320 overlies layout feature 310. Accordingly, layout feature 320 includes a tight tolerance feature 321 that corresponds to this overlap region. Tight tolerance feature 321 must be accurately formed in the final IC since the gate of a transistor is so critical to device performance.

Proximity Effect Halo

To ensure this accurate formation of tight tolerance feature 321, a proximity effect halo 331 is designated around tight tolerance feature 321. Proximity effect halo 331 extends a distance d from each edge of tight tolerance feature 321. Distance d represents a "proximity effect range" and is selected so that any features outside proximity effect halo 331 will have a negligible effect on tight tolerance feature 321 during reticle formation or wafer patterning. Note that the outer perimeter of proximity effect halo 331 could have rounded corners to maintain a completely constant spacing from tight tolerance feature 321. However, the square corners shown are simpler to define and process, and do not occupy a significantly larger area of the layout.

Together, tight tolerance feature 321 and proximity effect halo 331 form a tight tolerance zone 330. Enhanced care can be directed towards tight tolerance zone 330 during reticle formation to ensure accurate patterning, while standard care can be applied to the less dimension-critical regions outside of tight tolerance zone 330 to improve throughput.

Proximity Effect Range

As described previously, distance d is selected such that any feature or potential defect that could have a significant proximity effect on tight tolerance feature 321 will be included in proximity effect halo 331. Proximity effect halo 331 would typically not incorporate all features/defects that could introduce any amount of proximity effect during the printing of tight tolerance feature 321. Such a comprehensive approach would generally be undesirable, because distortions in IC elements below a certain level would not provide much benefit to IC performance, but would require an excessively large proximity effect halo. This approach, in turn, would tend to negate the efficiency benefits derived from applying enhanced care to only those tight tolerance zones as the tight tolerance zones would then be occupying most of the pattern area. Therefore, the proximity effect range should be selected to encompass only those features/potential defects that could have a proximity effect above a certain threshold on the tight tolerance feature.

Proximity effects show up during both the wafer patterning process (lithography) and the actual reticle formation processes. Accordingly, the proximity effect range could be derived from the process having the greatest sensitivity to proximity effects, i.e. the process in which threshold proximity effects arise at the greatest distance.

Wafer Patterning

The proximity effect range for wafer patterning is a function of both diffraction effects and process effects. A reticle layout is exposed onto a wafer by a radiation (light) source of a lithography tool. As the exposing light passes through the fine transparent regions of the reticle, diffraction effects between adjacent features lead to distortions in the patterns projected onto the resist layer of the wafer. These diffraction effects are a function of the lithography tool characteristics, including numerical aperture (NA), wavelength of the exposing radiation, and coherence of the exposing radiation, which is in turn a function of the type of illumination used (i.e. on-axis or off-axis illumination).

Further distortions can occur as the projected image is subsequently transferred into the wafer surface. These additional deformations are due to process effects that take place during the physical processing of the wafer. For example, because the intensity of the exposing light does not immediately drop to zero at the edges of layout features, but rather decreases at some gradient, the edges of those layout features are partially developed. Depending on the sharpness of the edge intensity gradient and the sensitivity of the resist, this partial edge developing can introduce additional deviations from the desired feature outline. Similarly, when the wafer is dry etched to transfer the pattern in the resist to the wafer surface, the resist layer that remains can be attacked by the etchant ions, thereby leading to further defects. In addition, the high temperatures used in the etch process can cause flow and distortion of the resist pattern.

According to one aspect of the invention, the wafer patterning proximity effect range can be derived through empirical data. Because of the complex interactions between the diffraction and process effects as described above, an empirical approach can provide a straightforward means for determining an appropriate proximity effect range. The empirical result can be derived from actual data from the lithography process. According to another aspect of the invention, a formula or model can be used to provide an estimate for the proximity effect range. For example, it is known that diffraction effects are proportional to wavelength over numerical aperture. Therefore, a formula for the approximate proximity effect range could be as follows:

$$d = k * \lambda / NA \quad [1]$$

where d is the proximity effect range, $\lambda$ is the wavelength of the exposing radiation, NA is the numerical aperture of the tool, and k is a correction constant that adjusts for the coherence of the exposing radiation and the resist and dry etch effects. A typical correction constant for a 365 nm wavelength, 0.6 NA process could be k=2.5, which would produce a proximity effect range d=1.5 $\mu$m. Changing the wavelength to 248 nm would then result in a proximity effect range d=1 $\mu$m. When using a formula-based approach, a "buffer offset" can be added to the calculated proximity effect range to ensure full coverage of the required area.

Reticle Writing/Inspecting

As indicated previously, it is possible that portions of the reticle formation process could have even more sensitivity to proximity effects than the lithography process. In such a case, the proximity effect range would be based on the affected step(s) within the reticle formation process. Typically, the reticle writing operation can have a high susceptibility to proximity effects. The two main techniques used to write IC layout data to a reticle are optical writing and electron beam (e-beam) writing. In an optical system, a light source is used to expose the IC layout pattern onto the reticle. Accordingly, the proximity effect range for such a process could be affected by diffraction of the light source. As with the wafer patterning procedure, the proximity effect range of an optical reticle writing system could be either determined through empirical data, or calculated using known optical formulae. However, because the reticle is typically written at 4 to 5 times the size of the final printed (wafer) image, the diffraction interactions would typically not be as great as those seen in a lithography step involving the same layout. Examples of optical reticle writing tools include the Core2564, Alta3000, Alta3500, and Alta3700 from ETEC Systems, Inc., and the Omega6000 tool from Micronic Laser Systems.

In an e-beam system, a focused electron beam (or a shaped beam for vector scan tools) is used to write specified patterns into the resist layer on the reticle surface. Because the beam is not being projected through a pattern, diffraction effects are minimized. However, as the electrons penetrate the resist, they can experience directional deflection as they pass through the resist layer (forward scattering) and when they enter the reticle surface (backscattering). These scattering effects "spread" the area exposed by the e-beam, and can therefore introduce significant proximity effects.

Scattering effects are exacerbated as e-beam power is increased to write more complex layout patterns. For example, a 10 keV e-beam tool may introduce scattering effects on the order of 2 $\mu$m for a 4–5× reticle. This translates into a 0.4–0.5 $\mu$m reticle proximity effect range (at the original layout size, i.e. 1×), which would typically be less than the wafer proximity effect range. However, a 50 keV e-beam tool can cause scattering effects on the order of 15 $\mu$m for a 4–5× reticle. These figures translate into a 3–3.75 $\mu$m reticle proximity effect range (1×), which can be significantly larger than the wafer proximity effect range. While modeling or calculation of the scattering effects could be possible, the complexity and probabilistic nature of the interactions could make such calculations difficult. Using empirical data to derive a proximity effect range for an e-beam tool could provide a more efficient and accurate value. Examples of e-beam reticle writing tools include the MEBES tools from ETEC Systems, Inc., the HL800, HL900, and HL950 tools from Hitachi, the JBX-6000FS tool from JEOL, Inc., and the Vectorbeam tool from Leica Lithography Systems, Ltd.

Finally, proximity effects also affect the inspection of the patterned reticle as an optical image from the completed reticle is typically used in the inspection process. Because this optical process is typically performed at a 4–5× magnification, inspection proximity effects should be much less pronounced than wafer proximity effects. However, as with lithography or reticle writing, an inspection proximity effect range could be determined either empirically or theoretically, and if larger than the lithography or reticle writing ranges, could be used to define the overall proximity effect range. Examples of reticle inspection tools include the KLA200 and KLA300 series tools from KLA-Tencor, Inc., the Orbot RT800, RT8000, and the ARIS-i tools from Applied Materials, Inc., and the 9MD series tools from Lasertech Corp.

Reticle Production

Figure 4A:
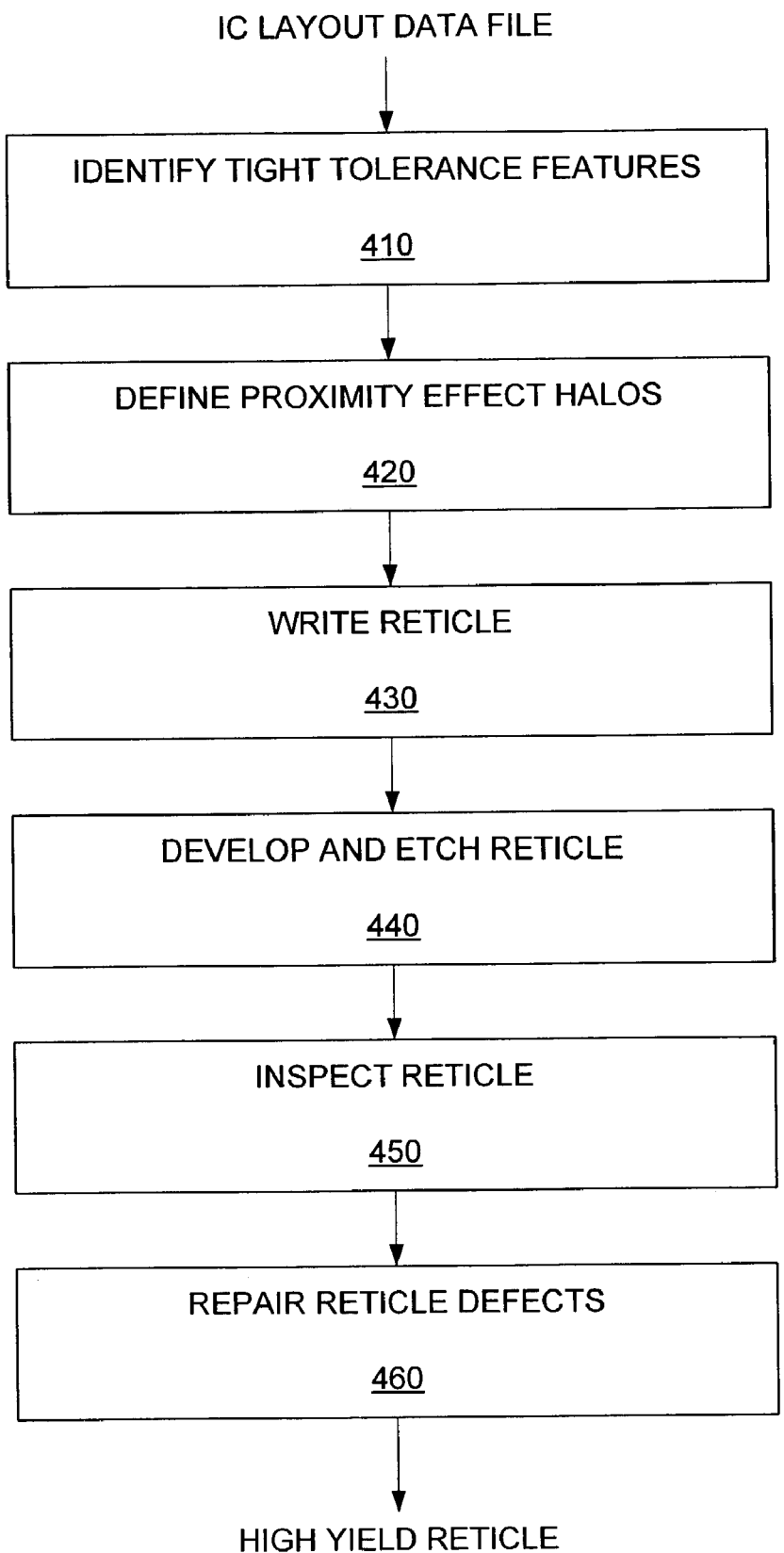
FIG. 4a shows a flow diagram of a reticle creation process in accordance with an embodiment of the invention.

Once the proximity effect range has been defined, it can be used in the creation of a reticle. FIG. 4a shows a flow diagram of a reticle writing method in accordance with one embodiment of the invention. In step 410, an IC layout data file is read and tight tolerance features are identified. The tight tolerance features can be identified manually by a user selecting individual elements of the layout requiring a high degree of transference precision. Alternatively, in another embodiment, automated means could be used to detect tight tolerance features, for example by detecting specific layout elements (e.g. transistor gates or capacitors) or specific layout feature configurations (e.g. a single-layer configuration, such as an isolated line, or a multi-layer configuration, such as a polysilicon feature over diffusion region). In another embodiment of the invention, the tight tolerance features can be automatically detected by scanning for OPC features (such as assist features or serifs), and then flagging the layout features associated with those OPC features. According to an embodiment of the invention, a design rule checker (DRC) tool could be used to detect tight tolerance features. For example, a gate region such as tight tolerance feature 321 in FIG. 3 can be identified by instructing a DRC tool to perform a Boolean AND operation between the polysilicon layer and the diffusion layer. Examples of DRC tools include ASSURA from Cadence Design Systems, Calibre from Mentor Graphics Corp., and Hercules from Avant!.

After identification of the tight tolerance features, proximity effect halos for each of the features are defined in step 420. According to one embodiment of the present invention, a proximity effect halo could be assigned as each tight tolerance feature is identified. As described previously, each proximity effect halo is formed by delineating a width equal to the proximity effect range from each edge of the associated tight tolerance feature. Each tight tolerance feature and associated proximity effect halo can be combined to form a tight tolerance zone. A reticle data file, including the proximity effect halo/tight tolerance zone data, can then be passed to a reticle writing tool.

The reticle is written in step 430, wherein the tight tolerance features and regions within the proximity effect halos are written with greater care than the rest of the IC layout. As noted previously, the blank (i.e. unpatterned) reticle can be written either optically or by an e-beam. While an optical tool typically exposes the reticle in a single step, e-beam tools require multiple steps to most effectively make use of the identified tight tolerance zones. FIG. 4b shows a flow diagram of a method for writing a reticle using a raster scan e-beam tool according to an embodiment of the invention. First, the e-beam is set to a small (high-precision) spot size in step 431b. The tight tolerance zones are then rastered in step 432b. Next, the e-beam is set to a large (high-speed) spot size in step 433b. Finally, the remainder of the reticle (non-tight tolerance zones) is rastered in step 434b, thereby completing the exposure process. According to another embodiment of the invention, the tight tolerance zones are rastered after the high-speed scan has exposed the non-tight tolerance regions.

Figure 5:
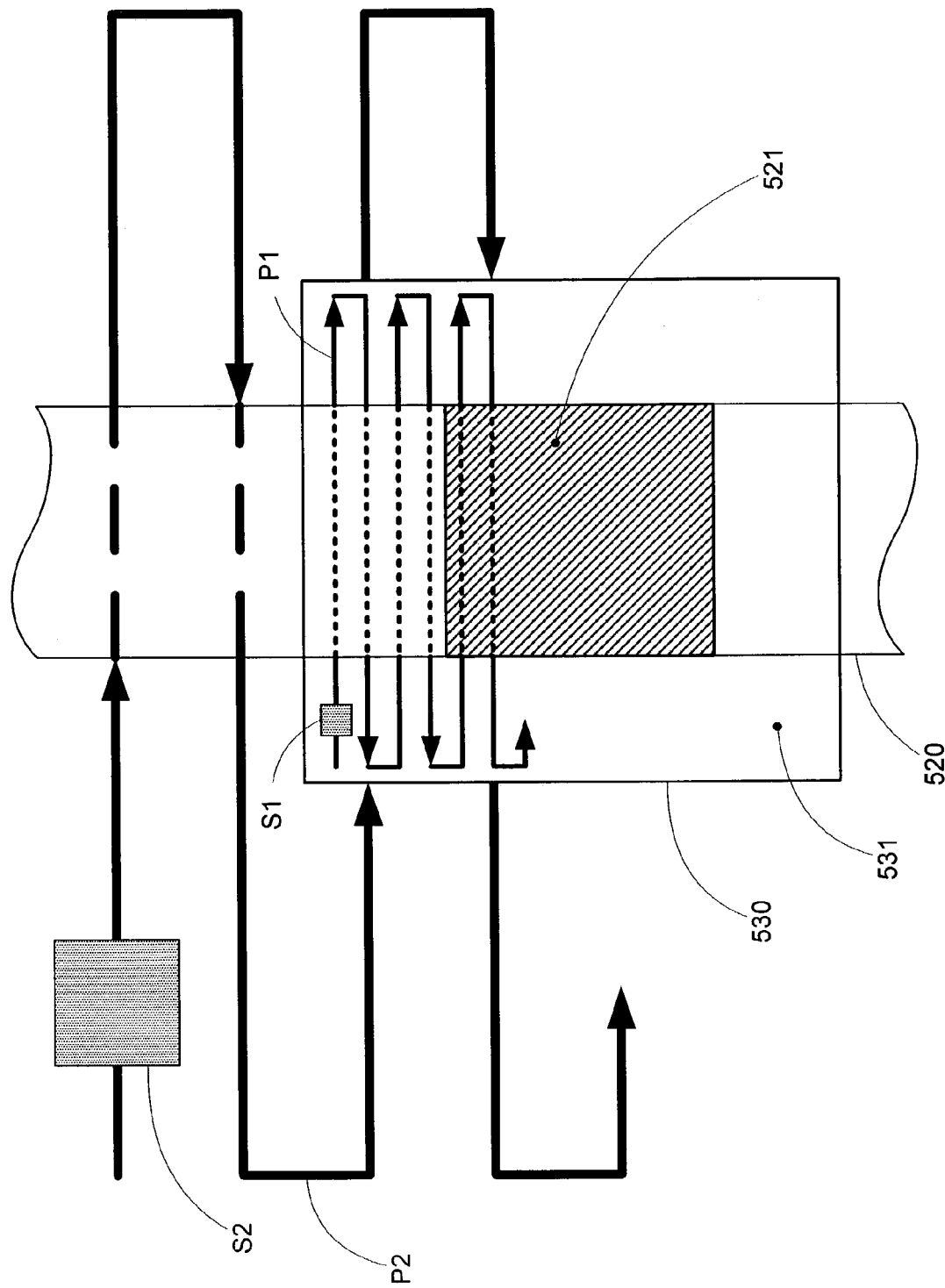
FIG. 5 illustrates a raster scan reticle writing process in accordance with an embodiment of the invention.

An example of an e-beam raster scan process as described in FIG. 4b is depicted in FIG. 5. FIG. 5 shows a portion of an IC layout, comprising a layout feature 520 that includes a tight tolerance feature 521. A proximity effect halo 531 has been identified around tight tolerance feature 521 to form a tight tolerance zone 530. An e-beam having a small spot size S1 is used to scan tight tolerance zone 530 along a path P1 to ensure accurate transfer of tight tolerance feature 521 and any adjacent areas that could contain features within the proximity effect range of feature 521. An e-beam having a large spot size S2 is used to scan the remaining portions of the IC layout along a path P2 to minimize the total time required for rastering.

Instead of using a raster scan method, an e-beam tool could be set up to perform vector scanning. FIG. 4c shows a flow diagram of a method for writing a reticle using a vector scan e-beam tool according to one embodiment of the invention. In a vector scan tool, the e-beam is moved directly to regions of the reticle to be exposed. Each of those regions is fractured into primitive shapes, with each of the primitive shapes being exposed by the similarly shaped e-beam in a single shot. If any of the primitive shapes are very narrow (i.e. very low or very high aspect ratio), the accuracy and quality of the exposure process can be degraded. In conventional vector scan systems, undesirable primitives are difficult to avoid because such a large amount of data is being fractured. However, in step 431c, just the tight tolerance zones are fractured, thereby enabling greater control over the fracturing process to avoid excessively narrow primitives. An example of a fracturing tool is the CATS tool from Transcription Enterprise Inc., a subsidiary of Numerical Technologies, Inc.

Because such a limited area is being fractured, the final primitives can be readily adjusted to optimize their shapes. According to an aspect of the invention, a tight tolerance zone including a transistor gate could be fractured for a negative resist process such that the gate (i.e. the tight tolerance feature) is a single primitive. The gate could then be exposed in a single shot for enhanced accuracy. According to another aspect of the invention, a tight tolerance zone including a transistor gate could be fractured for a positive resist process such that the proximity effect halo is decomposed into equal-sized primitives. Since the complement of layout features is typically being exposed in a positive resist process, the use of consistent primitives enhances the regularity of the actual (unexposed) feature.

After the fracturing step of 431c, each primitive is exposed in a single shot by a correspondingly shaped beam in step 432c. In step 433c, the remaining data is fractured, and in step 434c, those remaining primitives are exposed. According to another embodiment of the invention, the fracturing of the non-tight tolerance portions of the layout (step 433c) is performed immediately after the fracturing of the tight tolerance zones (step 431c), after which all the primitives are exposed by the electron beam.

Returning to FIG. 4a, once the reticle has been written, the exposed pattern is developed in the resist and is subsequently etched into the chrome layer of the reticle in step 440. The finished reticle is then inspected in step 450. According to one embodiment of the invention, the inspection process could be set up to apply high inspection sensitivity to the regions of the reticle corresponding to tight tolerance zones while applying standard (i.e. less stringent) inspection sensitivity to the remainder of the reticle. In this manner, the truly key portions of the reticle are carefully checked to ensure a high yield reticle, whereas the less crucial portions of the reticle are inspected at a more appropriate level, to allow a faster overall inspection process.

Finally, any defects or deviations from the desired pattern detected in step 450 are repaired in step 460. According to an embodiment of the invention, a focused ion beam (FIB) tool could be used to perform precise repairs within the tight tolerance zones, while a laser tool could be used to more quickly fix defects in less sensitive regions.

High Yield Reticle System

Figure 6:
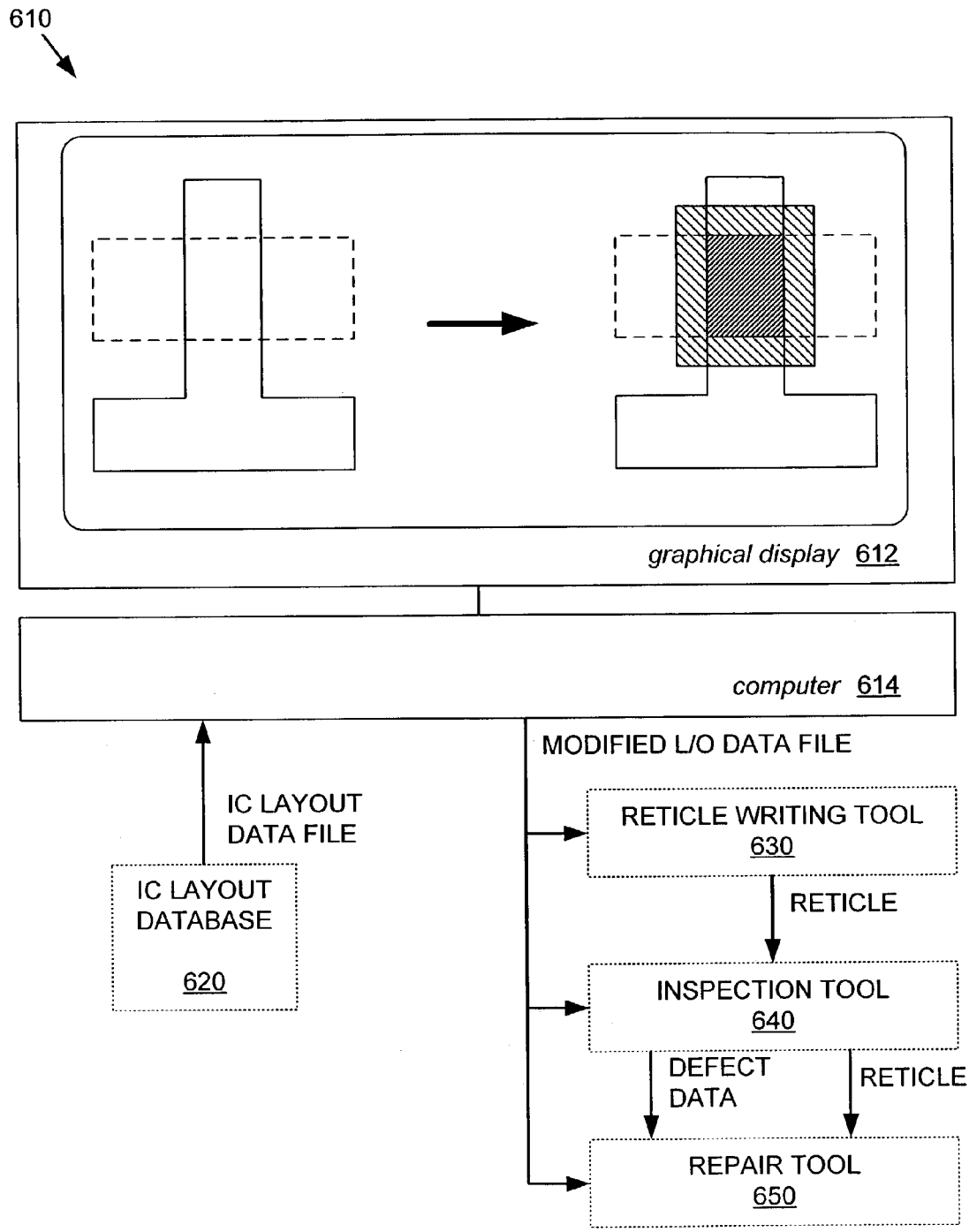
FIG. 6 shows a diagram of a reticle layout processing system in accordance with an embodiment of the present invention.

FIG. 6 shows a diagram of a proximity effect halo processing system 610 according to one embodiment of the invention. System 610 comprises at least one computer 614 and a graphical display 612. Computer 614 could comprise a personal computer (PC) running Microsoft™ software and/or a workstation such as a Sun™ workstation running the Solaris™ operating system. Graphical display 612 allows a user to monitor and control the IC layout processing operations being performed by system 610. For example, graphical display 612 could provide a graphical user interface (GUI) through which a user could input proximity effect range specifications or tight tolerance feature settings.

Computer 614 typically includes a processing module to identify tight tolerance features of an IC layout and define proximity effect halos, as described in steps 410 and 420, respectively, of the flow diagram shown in FIG. 4*a*. According to an aspect of the invention, the processing module can be implemented in software. According to another aspect of the invention, the processing module can be a hardware element, such as a ROM (random operating memory) chipset.

FIG. 6 also shows an IC layout database 620, a reticle writing tool 630, an inspection tool 640, and a repair tool 650, all of which may be located physically apart from system 610. IC layout database 620 can provide a centralized storage area for IC layout data files. Alternatively, the IC layout data files could be stored locally in computer 614, or even in reticle writing tool 630. According to an aspect of the invention, computer 614 may access IC layout database 620 for files to be processed for reticle writing through a local area network (LAN). In another embodiment of the invention, IC layout database 620 may be accessed though a wide area network (WAN), such as the Internet. System 610 sends the reticle data file (including proximity effect halo information) to reticle writing tool 630, which patterns the reticle and sends it to inspection tool 640. Inspection tool 640 is also provided with the modified layout data file so that the inspection process can be optimized. Finally, the inspected reticle and its associated defect data are provided to repair tool 650, along with the modified layout data file. Repair tool 650 can then perform defect repair based on the tight tolerance zones defined in the modified layout data file. According to an aspect of the invention, repair tool 650 could be set to perform high-precision repairs on defects within the tight tolerance zones and low-precision repairs on all other defects. According to another embodiment of the invention, repair tool 650 could be replaced with two different repair tools, a focused ion beam tool for tight tolerance zone defects, and a laser tool for all other defects. As with IC layout database 620, reticle writing tool 630, inspection tool 640, and repair tool 650 may be connected to computer 614 through a LAN or a WAN, or may communicate through a direct (i.e. non-networked) connection.

CONCLUSION

Thus, the present invention ensures efficient production of high yield reticles. Specifically, by identifying IC layout features requiring a high degree of accuracy, and then identifying the adjacent regions that could affect the formation of those features, the portions of a reticle that strongly affect the performance of the final IC can be precisely formed and inspected. At the same time, less stringent controls can be placed on the formation and inspection of the remaining areas, thereby minimizing the time required to form the finished reticle.

The above disclosure is not intended to be limiting. Numerous modifications and variations of the invention will be apparent to one of ordinary skill in the art. For example, while tight tolerance feature 321 is shown as representing a transistor gate in FIG. 3, any layout feature(s) could be specified as the tight tolerance feature(s). Similarly, while tight tolerance feature 321 and tight tolerance zone 330 in FIG. 3 are shown as having substantially rectangular outlines, a tight tolerance feature could have any outline and its associated tight tolerance zone would simply parallel that outline. Also, while system 610 in FIG. 6 is depicted as a computer 614, system 610 could also be a client for a remote server that does the actual layout processing. In addition, while system 610 is shown as being separate from reticle writing tool 630, system 610 could be incorporated directly in tool 630. Therefore, the invention is limited only by the following claims.

What is claimed is:

1. A reticle for transferring an integrated circuit layout to a wafer, the reticle comprising:
    at least one layout feature having an area designated a tight tolerance feature and an area designated as a proximity effect halo, wherein the areas designated as a tight tolerance feature and as a proximity effect halo were subjected to a write, test, or repair process having a tighter tolerance than other areas on the reticle.

2. A reticle for transferring an integrated circuit layout to a wafer, the reticle comprising:
    a first set of layout features having a first tolerance;
    a second set of layout features being within a proximity effect halo of the first set of layout features, the second set of layout features having the first tolerance; and
    a third set of layout features being outside the proximity effect halo of the first set of layout features, the third set of layout features having a second tolerance, wherein the second tolerance is less tight than the first tolerance.

3. The reticle of claim 2, wherein at least one of the first set of layout features includes a transistor gate.

4. The reticle of claim 2, wherein at least one of the first set of layout features includes a capacitor.

5. The reticle of claim 2, wherein at least one of the first set of layout features includes a feature associated with an optical proximity correction (OPC) and at least one of the second set of layout features includes the associated optical proximity correction.

6. The reticle of claim 2, wherein at least one of the third set of layout features includes an interconnect line.

7. The reticle of claim 2, wherein at least one of the third set of layout features includes a contact pad.

8. The reticle of claim 2, wherein the proximity effect halo includes an inner perimeter and an outer perimeter, wherein a distance between the inner perimeter and the outer perimeter is substantially constant.

9. The reticle of claim 8, wherein the reticle is used in a lithography process using an exposing radiation of a substantially constant wavelength and having a substantially constant numerical aperture (NA), the distance being estimated by dividing the substantially constant wavelength by the NA and multiplying the result by a constant correction factor to compensate for resist and etch effects.

10. The reticle of claim 9, wherein the distance is approximately equal to 1.5 microns when the substantially constant wavelength is 365 nm and the NA is 0.6.

11. The reticle of claim 9, wherein the distance is approximately equal to 1.0 microns when the substantially constant wavelength is 248 nm and the NA is 0.6.

12. The reticle of claim 9, wherein the distance is between 3.0 μm and 3.75 μm for a 50 keV electron beam reticle writing process.

13. A reticle for transferring an integrated circuit layout to a wafer, the reticle comprising:
- a first layout feature having a first tolerance;
- a second layout feature being within a proximity effect halo of the first layout feature, the second layout feature having the first tolerance; and
- a third layout feature being outside the proximity effect halo of the first layout feature, the third feature having a second tolerance, wherein the second tolerance is less tight than the first tolerance.

14. The reticle of claim 13, wherein the first layout feature includes a transistor gate.

15. The reticle of claim 13, wherein the first layout feature includes a capacitor.

16. The reticle of claim 13, wherein the first layout feature includes a feature associated with an optical proximity correction (OPC) and the second layout feature includes the associated optical proximity correction.

17. The reticle of claim 13, wherein the third layout feature includes an interconnect line.

18. The reticle of claim 13, wherein the third layout feature includes a contact pad.

19. The reticle of claim 13, wherein the proximity effect halo includes an inner perimeter and an outer perimeter, wherein a distance between the inner perimeter and the outer perimeter is substantially constant.

20. The reticle of claim 13, wherein the reticle is used in a lithography process using an exposing radiation of a substantially constant wavelength and having a substantially constant numerical aperture (NA), the distance being estimated by dividing the substantially constant wavelength by the NA and multiplying the result by a constant correction factor to compensate for resist and etch effects.

21. The reticle of claim 20, wherein the distance is approximately equal to 1.5 microns when the substantially constant wavelength is 365 nm and the NA is 0.6.

22. The reticle of claim 20, wherein the distance is approximately equal to 1.0 microns when the substantially constant wavelength is 248 nm and the NA is 0.6.

23. The reticle of claim 20, wherein the distance is between 3.0 μm and 3.75 μm for a 50 keV electron beam reticle writing process.

24. A system for creating a reticle data file from an integrated circuit (IC) layout data file, the system comprising:
- a processing module, the processing module being configured to read the IC layout data file, identify a plurality of specified layout features in the IC layout data file, and define a halo region having a substantially constant width around each of the plurality of specified layout features, wherein the areas designated as a tight tolerance feature and as a proximity effect halo will be subject to a writing, inspection, or repair process having a tighter tolerance than other areas on the reticle; and
- a graphical display, the graphical display being configured to provide a graphical user interface (GUI) to allow user input and control of the processing module.

25. The system of claim 24, wherein the processing module comprises a personal computer.

26. The system of claim 24, wherein the processing module is coupled to receive the IC layout data file from a remote database through a local area network.

27. The system of claim 24, wherein the processing module is coupled to receive the IC layout data file from a remote database through a wide area network.

28. The system of claim 24, wherein the processing module is directly connected to a reticle writing tool.

29. The system of claim 24, wherein the processing module is configured to send the reticle data file to a reticle writing tool through a local area network.

30. The system of claim 24, wherein the processing module is configured to send the reticle data file to a reticle writing tool through a wide area network.

* * * * *